(12) United States Patent
Fukui

(10) Patent No.: US 6,470,468 B1
(45) Date of Patent: Oct. 22, 2002

(54) TEST PATTERN GENERATOR, PROPAGATION PATH DISCONNECTING METHOD, AND DELAY FAULT DETECTING METHOD

(75) Inventor: Yoshiaki Fukui, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/477,401

(22) Filed: Jan. 4, 2000

(30) Foreign Application Priority Data

Jul. 29, 1999 (JP) .......................................... 11-215753

(51) Int. Cl.[7] .......................... G01R 31/28; G06F 9/318
(52) U.S. Cl. ....................................... 714/744; 714/741
(58) Field of Search ............................... 714/724–738, 714/744, 741

(56) References Cited

U.S. PATENT DOCUMENTS 5,422,891 A * 6/1995 Bushnell et al. ............. 714/724
5,748,646 A * 5/1998 Hosokawa ................... 714/726
6,067,650 A * 5/2000 Beausang et al. ........... 714/724
6,148,425 A * 11/2000 Bhawmik et al. ............. 714/25

FOREIGN PATENT DOCUMENTS

| EP | 585086 A2 * | 3/1994 | ........... G01R/31/28 |
| JP | 9274621 | 10/1997 | |
| JP | 1152024 | 2/1999 | |

* cited by examiner

Primary Examiner—Albert Decady
Assistant Examiner—Cynthia Harris
(74) Attorney, Agent, or Firm—Leydig, Voit & Mayer, Ltd.

(57) ABSTRACT

A test pattern generator for automatically generating a test pattern for detecting a stack fault of a large scale integrated circuit an LSI with a tester includes a loop/path disconnecting section for disconnecting a loop portion of the LSI at a position where a fault detection rate is not lowered, based on net list information of the LSI and constraint of a test design rule when automatically generating the test pattern. A test pattern generator increasing fault detection rate and carrying out a suitable test is obtained.

5 Claims, 12 Drawing Sheets

TEST PATTERN GENERATOR, PROPAGATION PATH DISCONNECTING METHOD, AND DELAY FAULT DETECTING METHOD

FIELD OF THE INVENTION

The present invention relates to a test pattern generator used at the time of developing an LSI, a loop disconnecting method, a propagation path disconnecting method, a delay fault detecting method, and a computer-readable recording medium recorded with a program for making the computer execute these methods. More particularly, this invention relates to a test pattern generator for detecting a stack fault or a delay fault by a scan test method, a loop disconnecting method, a propagation path disconnecting method, a delay fault detecting method, and a computer-readable recording medium recorded with a program for making the computer execute these methods.

BACKGROUND OF THE INVENTION

In recent years, in order to effectively achieve a high reliability of an LSI, a test-facilitating design has been provided and there have been carried out detection of a stack fault or a delay fault by using a test pattern automatic generating tool (an ATPG tool) based on a scan test method. In testing a stack fault of an LSI, when there is a loop portion within the LSI to be tested, it is necessary to disconnect this loop. Further, in detecting a delay fault, it has been required to use a clock signal of an active operation frequency (at-speed) for the test.

As a prior-art test pattern generator, there is available an ATPG tool for carrying out a test by automatically disconnecting a loop and by using a clock signal of at-speed. The loop disconnecting method according the prior-art ATPG tool for detecting a stack fault will be explained at first. FIG. 12 is a circuit diagram that shows an example of a prior-art circuit in an LSI having a loop portion, and FIG. 13 explains a prior-art method of disconnecting the loop existing within the LSI.

Assume, for example, that within the LSI to be tested, there exists a loop circuit with a two-input AND element 51, a two-input OR element 52, input terminals 53 and 56, and output terminals 54 and 55, as shown in FIG. 12. In the case of detecting a stack fault, the input terminal 53 or the input terminal 56 is fixed at a value of "0" or "1" (a logic value of 0 and 1), according to a condition of constraint describing a condition for satisfying a test design rule. According to the prior-art ATPG tool, regardless of whether the value of the input terminal 53 is fixed at "0" or the value of the input terminal 56 is fixed at "1", a position of disconnection is determined and a loop is disconnected, and the value of a disconnection end 57 after the disconnection is fixed at "X (0 or 1)".

Next, a method of detecting a delay fault using a prior-art clock signal of at-speed will be explained. FIG. 14 shows an example of a prior-art scan test circuit for detecting a delay fault. It is assumed that a delay fault is to be detected in a scan test circuit with scan flip-flops (SFF) 61 and 62, inverter elements 63 and 64, an AND element 65, and OR elements 66 and 67, as shown in FIG. 14, for example. A propagation path from a Q terminal of the SFF 61 through the inverter element 653, the AND element 65, and the OR element 66 to a D terminal of the SFF 62 forms a combination circuit to be tested.

FIG. 15 is a timing chart for showing the operation of detecting a delay fault in the prior-art scan test circuit. In the operation of detecting a delay fault in the prior-art scan test circuit, a system clock at-speed (scan clock) is used. A scan operation is switched to a system operation by a change in data 74 at a scan-enable terminal (SM terminal) (not shown) of the SFFs 61 and 62. In FIG. 15, 71 designates a period of a scan operation, and 72 and 73 designate periods (N–1 period, N period) during which the scan operation has been switched to the system operation. Data set in the SFF 61 in the test-period width passes through the combination circuit to be tested and is propagated to the SFF 62. Based on this propagation, it is determined whether the data has been collected correctly in the period 73, to detect a delay fault.

According to the above-described prior-art technique, in the case of detecting a stack fault, regardless of whether the value of the input terminal 53 is fixed at "0" or the value of the input terminal 56 is fixed at "1", a position of disconnection is determined and a loop is disconnected, and the value of the disconnection end 57 is fixed at "X". Therefore, the loop is not necessarily disconnected at an optimum position where a fault detection rate is improved. The loop may be disconnected at a position where the fault detection rate is lower. Thus, there has been a problem that it is not possible to carry out a suitable test.

Further, in the case of detecting a delay fault, the test is carried out by using a clock of at-speed. Therefore, there has been a problem that it is not possible to detect a delay fault in a path where the delay exceeds the test period of at-speed, and that the fault detection rate is lowered, so that it is not possible to carry out a suitable test. In this case, it is considered possible to insert a flip-flop (FF) or a D latch by manually disconnecting a path so that data can be propagated between the two SFFs during a test period of at-speed. However, in this case, there is no guarantee that the path is disconnected at a suitable position where the fault detection rate increases. Further, as the number of paths to be disconnected increases substantially, it has been practically impossible to manually disconnect the path.

SUMMARY OF THE INVENTION

In the light of the above-described problems, it is an object of the present invention to provide a test pattern generator, a loop disconnecting method, a propagation path disconnecting method and, a delay fault detecting method, increasing fault detection rate and capable of carrying out a suitable test, and a computer-readable recording medium recorded with a program for making the computer execute these methods.

According to a first aspect of this invention, a disconnecting unit automatically disconnects a loop portion of the integrated circuit at an optimum position where the fault detection rate is not lowered, based on the circuit structure information and three condition of constraint. Thus, it is possible to optimize the position where the loop is disconnected.

Further, the disconnecting unit automatically disconnects a disconnection end at a value which does not lower the fault detection rate, based on the circuit structure information and the condition of constraint. Thus, it is possible to optimize the position where the loop is disconnected and to optimize the value of disconnection, as well.

According to a second aspect of this invention, a disconnecting unit automatically disconnects a propagation path having a delay exceeding a test period at an optimum position where the delay is accommodated within the test period so that the fault detection rate is not lowered, based on the circuit structure information, the condition of constraint and the delay information. Thus, it is possible to optimize the position where the propagation path is disconnected so that it becomes possible to detect a delay fault of the propagation path having a delay exceeding the test period of the frequency of the actual operation.

Further, the disconnecting unit automatically sets a disconnection end at a value which does not lower a fault detection rate, based on the circuit structure information, the condition of constraint and the delay information. Thus, it is possible to optimize the position where the propagation path is disconnected and, to optimize the value for the disconnection, as well.

According to a third aspect of this invention, a generating unit applies a data take-in clock to the propagation path by at least two times and generate a pattern for observing a value taken in by the clock according to the delay information of the propagation path. Thus, it becomes possible to detect a delay fault of a propagation path having a delay exceeding the test period of the frequency of the actual operation, without disconnecting the propagation path, in other words, without changing the circuit structure.

According to a forth aspect of the invention, a loop position of the integrated circuit is automatically disconnected at an optimum position so that the fault detection rate is not lowered, based on the circuit structure information and the condition of constraint at the disconnection process. Thus, at the time of automatically generating a test pattern, in detecting a stack fault using a scan test method, it is possible to optimize the position where the loop is disconnected.

Further, the disconnection end is automatically set at a value which does not lower the fault detection rate, based on the circuit structure information and the condition of constraint at the setting process. Thus, in detecting a stack fault using a scan test method, at the time of automatically generating a test pattern, it is possible to optimize the position where the loop is disconnected and to optimize the value for the disconnection.

According to a fifth aspect of this invention, in a disconnection process, a propagation path having a delay exceeding a test period is automatically disconnected at an optimum position where the delay is accommodated within the test period so that the fault detection rate is not lowered, based on the circuit structure information, the condition of constraint and the delay information. Thus, in the detection of a delay fault using a scan test method, at the time of automatically generating a test pattern, it is possible to optimize the position where the propagation path is disconnected so that it becomes possible to detect a delay fault of the propagation path having a delay exceeding the test period of the frequency of the actual operation.

Further, in the setting process, a disconnection end is automatically set at a value which does not lower a fault detection rate, based on the circuit structure information, the condition of constraint and the delay information. Thus, in the detection of a delay fault using a scan test method, at the time of automatically generating a test pattern, it is possible to optimize the position where the propagation path is disconnected and to optimize the value for the disconnection, as well.

According to a sixth aspect of this invention, in a application process, a data take-in clock is applied to the propagation path by at least two times, and at the observation process, a value taken in by the clock according to the delay information of the propagation path is observed. Thus, it becomes possible to detect a delay fault of a propagation path having a delay exceeding the test period of the frequency of the actual operation, without disconnecting the propagation path, in other words, without changing the circuit structure.

According to a seventh aspect of this invention, a program for making a computer execute the above-described methods according to the invention is recorded on a recording medium. Thus, it is possible to make the computer execute the above-described methods according to this invention.

Other objects and features of this invention will become apparent from the following description with reference to the accompanying drawings.

DESCRIPTION OF THE PREFERRED EMBODIMENTS

There is provided below, with reference to the drawings, a detailed description of preferred embodiments of a test pattern generator, a loop disconnecting method, a propagation path disconnecting method, a delay fault detecting method, and a computer-readable recording medium recorded with a program for making the computer execute these methods, each according to the present invention. It is to be noted that the invention is not limited to these embodiments.

Figure 1:
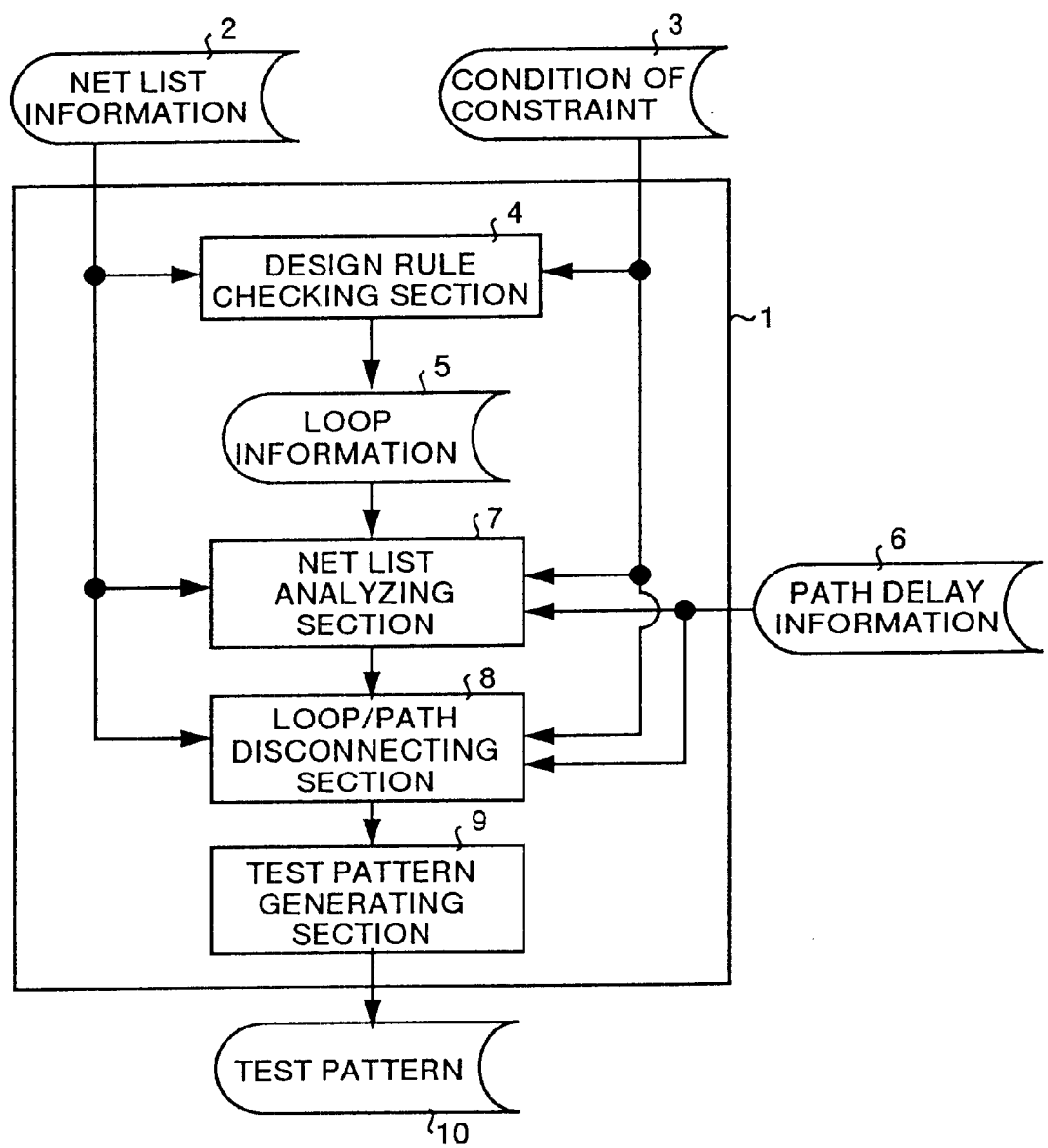
FIG. 1 is a schematic configuration of a test pattern generator according to a first embodiment of the present invention.

FIG. 1 is an explanatory diagram for showing a schematic configuration of a test pattern generator according to a first embodiment of the present invention. A test pattern generator 1 includes a design rule checking section 4 for checking a design rule in a test (a test design rule), a net list analyzing section 7 for analyzing (net list analysis) a net list (a circuit structure), a loop/path disconnecting section 8 for disconnecting a loop not shown and a propagation path not shown existing within an LSI to be tested, and a test pattern generating section 9 for generating a test pattern 10 for a stack fault detection and a delay fault detection according to a scan test method.

The design rule checking section 4 receives circuit structure information (net list information) 2 of an LSI not shown to be tested, and a condition of constraint 3 describing a condition for meeting the test design rule. The design rule checking section 4 then checks whether the circuit structure of the LSI is against the design rule or not, and detects a loop portion which is against the test design rule. The design rule checking section 4 then generates loop information 5 that is the information of the loop existing within the LSI.

The net list analyzing section 7 reads the net list information 2, the condition of constraint 3, the loop information 5, and path delay information 6 generated by a static timing verification tool not shown, and analyzes the net list based on these information. The loop/path disconnecting section 8 disconnects a loop and a path within the LSI, based on the net list information 2, the condition of constraint 3, the path delay information 6, and the information analyzed by the net list analyzing section 7. The design rule checking section 4, the net list analyzing section 7 and the loop/path disconnecting section 8 correspond to the disconnecting unit of the present invention.

The operation of the first embodiment having the above-described structure will be explained below with reference to FIGS. 2 to 9, in the order of (1) a loop disconnecting operation at the time of detecting a stack fault and (2) a path disconnecting operation at the time of detecting a delay fault.

(1) A Loop Disconnecting Operation at the Time of Detecting a Stack Fault

Figure 2:
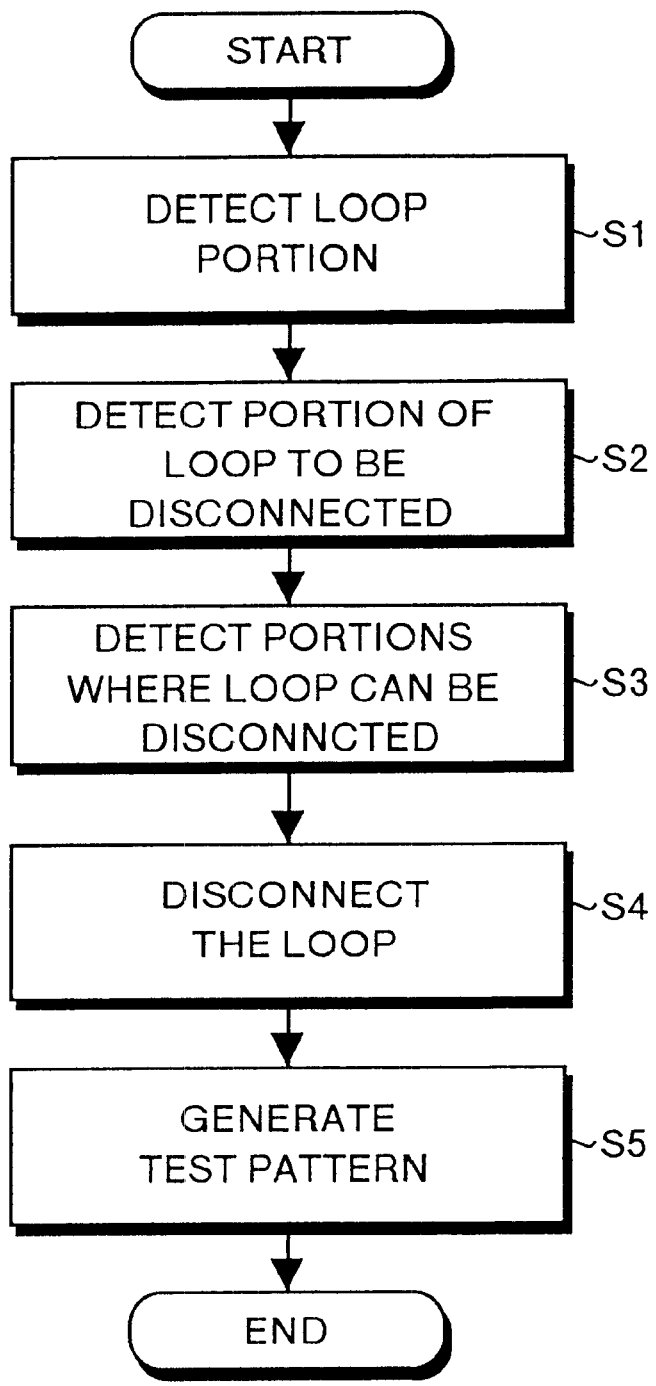
FIG. 2 is a flowchart that shows the flow of a loop disconnecting operation according to the first embodiment.

FIG. 2 is a flowchart that shows the flow of a loop disconnecting operation according to the first embodiment. In the loop disconnecting operation according to the first embodiment, at first, the design rule checking section 4 reads the net list information 2 and the condition of constraint 3, detects a loop portion that is against the test design rule, and outputs loop information 5 (step S1). Next, the net list analyzing section 7 detects a portion where the loop is to be disconnected, based on the net list information 2, the loop information 5 and the condition of constraint 3 (step S2).

Subsequently, the loop/path disconnecting section 8 virtually inserts an AND element and an OR element to all portions where the loop is to be disconnected, based on the information analyzed by the net list analyzing section 7, and searches a portion where the loop can be disconnected logically (step S3). Then, the loop/path disconnecting section 8 disconnects the loop at a portion where it is possible to obtain the highest fault detection rate, and sets a value (a value of logic 0, 1) of a disconnection end where the highest fault detection rate can be obtained (step S4). Finally, the test pattern generating section 9 generates the test pattern 10 (step S5).

Figure 3:
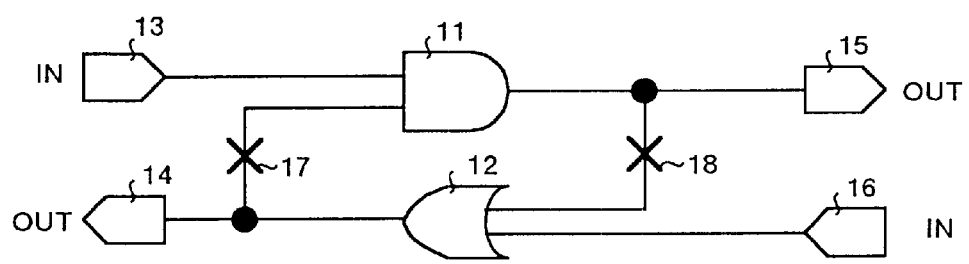
FIG. 3 shows an example of a loop existing within an LSI.
Figure 4:
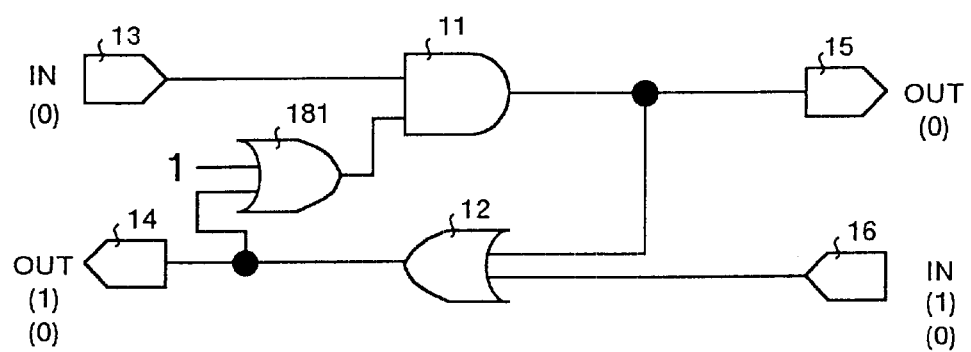
FIG. 4 shows an example of a disconnected loop.
Figure 5:
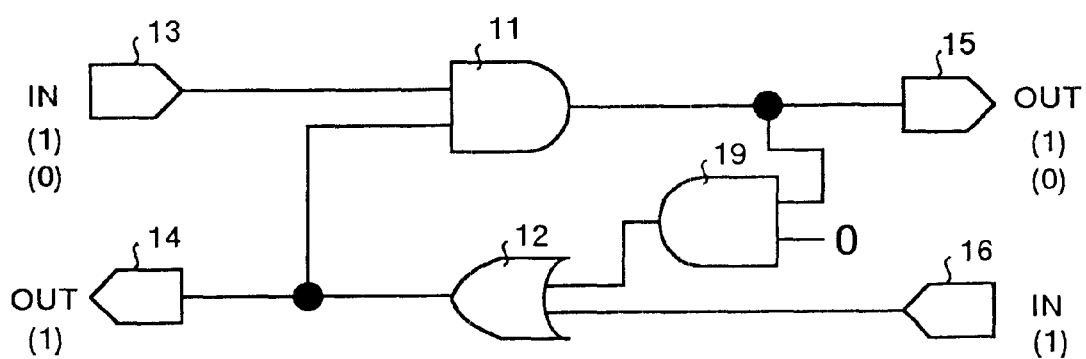
FIG. 5 shows an another example of a disconnected loop.

FIG. 3 shows an example of a loop portion existing within an LSI. FIG. 4 shows an example of a disconnected loop and FIG. 5 shows an another example of a disconnected loop. It is assumed, for example, that there exists a loop circuit equipped with a two-input AND element 11, a two-input OR element 12, input terminals 13 and 16, and output terminals 14 and 15, within an LSI not shown to be tested, as shown in FIG. 3. In this case, it is considered possible to disconnect the loop at a positions 17 or 18.

When a value of the input terminal 13 is fixed at "0" by the condition of constraint 3, the loop/path disconnecting section 8 disconnects the loop at the position 17 where the highest fault detection rate can be obtained, and develops the loop. An OR element 181 is virtually inserted into this disconnected position, and a value "1" is fixed at one input terminal of the OR element 181, so that an output value (an output signal) of the OR element 12 is not propagated thereto, as shown in FIG. 4. In other words, the disconnection end is fixed at a value at which the highest fault detection rate can be obtained. In the manner as described above, a loop disconnection position is optimized according to the condition of constraint 3, and a value at the time of the disconnection is optimized. Thus, it is possible to detect a stack fault of "0" and "1" of the output terminal 14 from the input terminal 16.

On the other hand, when a value of the input terminal 16 is fixed at "1" by the condition of constraint 3, the loop/path disconnecting section 8 disconnects the loop at the position 18 where the highest fault detection rate can be obtained, and develops the loop. An AND element 19 is virtually inserted into this disconnected position, and a value "0" is fixed at one input terminal of the AND element 19, so that an output value of the AND element 11 is not propagated thereto, as shown in FIG. 5. In other words, the disconnection end is fixed at a value at which the highest fault detection rate can be obtained. In the manner as described above, a loop disconnection position is optimized according to the condition of constraint 3, and a value at the time of the disconnection is optimized. Thus, it is possible to detect a stack fault of "0" and "1" of the output terminal 15 from the input terminal 13.

In other words, when a loop disconnection position is optimized and when a value for the disconnection is optimized according to the condition of constraint 3, it becomes easy to set a status of a signal line within an LSI by using an external pin (input), and it also becomes easy to monitor this status by using the external pin (output).

(2) A Path Disconnecting Operation at the Time of Detecting a Delay Fault

Figure 6:
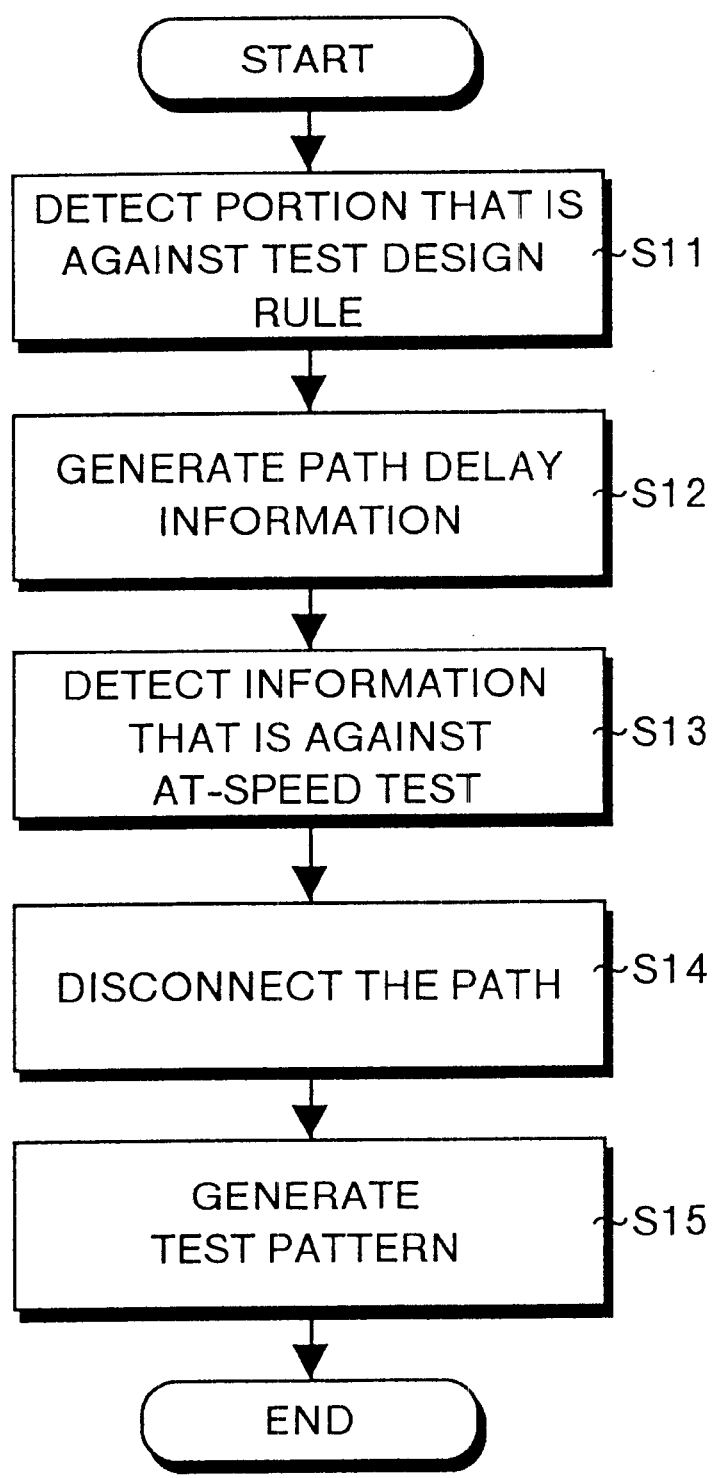
FIG. 6 is a flowchart showing the flow of a path disconnecting operation according to the first embodiment.

FIG. 6 is a flowchart that shows the flow of a path disconnecting operation according to the first embodiment. In the path disconnecting operation according to the first embodiment, at first, the design rule checking section 4 reads the net list information 2 and the condition of constraint 3, and detects a portion that is against the test design rule (step S11). Next, the design rule checking section 4 extracts a path having a delay of equal to or larger than a test period of at-speed based on a result of a timing check at the frequency of actual operation (at-speed) by a static timing verification tool, and generates path delay information 6 corresponding to the delay of the path (step S12).

Subsequently, the net list analyzing section 7 reads the net list information 2, the path delay information 6 and the condition of constraint 3, and detects a path having a delay of equal to or larger than the at-speed test period as information of against the at-speed test. Then, the net list analyzing section 7 displays a message and outputs a list on the detected information of against the at-speed test (step S13). The loop/path disconnecting section 8 disconnects a path between a combination circuit between scan flip-flops (SFFs) so that a signal can be propagated within an at-speed test period, based on the net list information 2, the path delay information 6 and the condition of constraint 3, and inserts a test circuit to be described later (step S14). In this case, the position at which the test circuit is inserted is controlled so that delays in the paths before and after the inserted test circuit become uniform, based on the path delay information 6. Finally, the test pattern generating section 9 generates the test pattern 10 (step S15).

Figure 7:
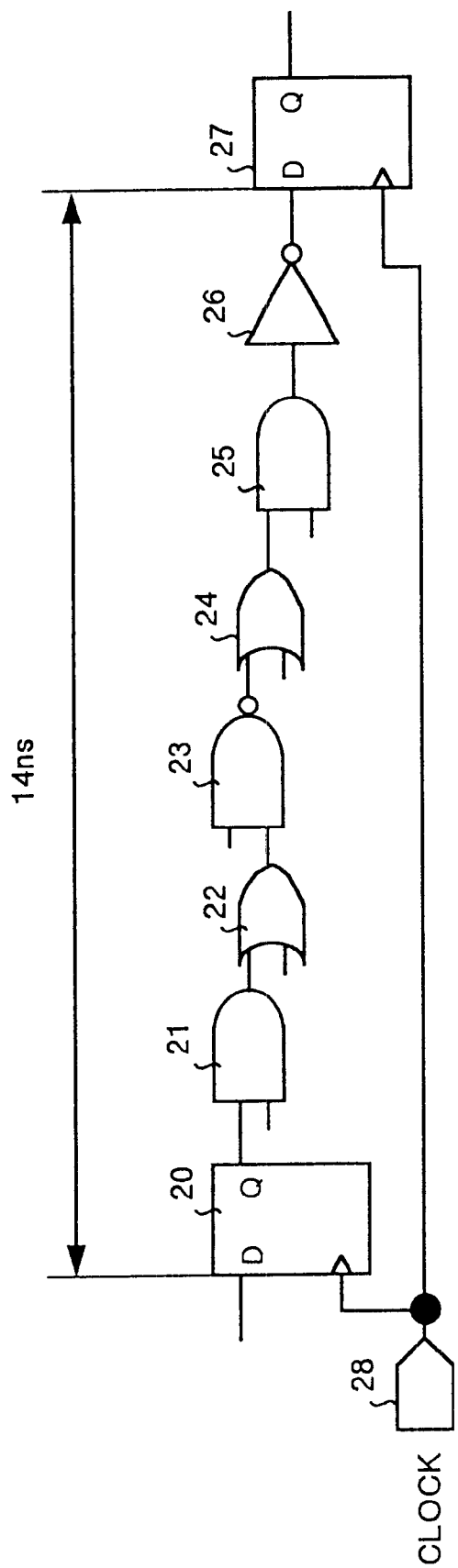
FIG. 7 shows an another example of a path existing within an LSI.
Figure 8:
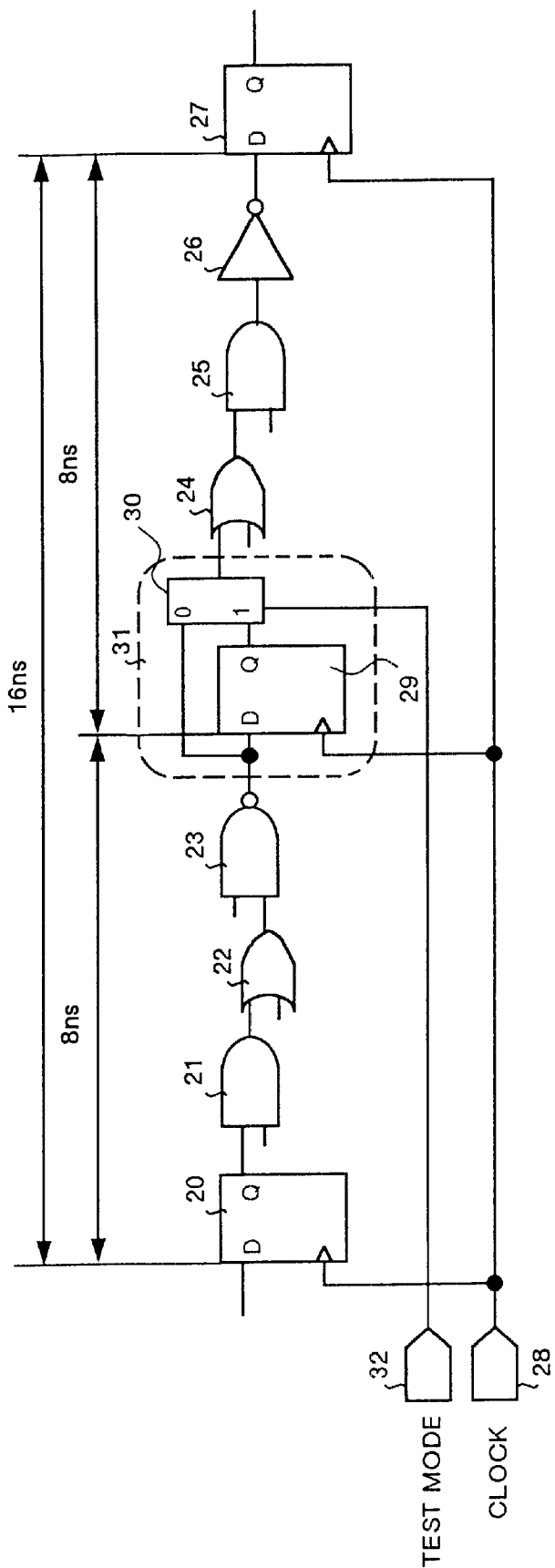
FIG. 8 shows an example of a disconnected path.

FIG. 7 shows an example of a path existing within an LSI. FIG. 8 shows an example of a disconnected path, and FIG.

9 shows another example of the disconnected path. It is assumed, for example, that, as, shown in FIG. 7, there exist a path having a delay of 14 ns, consisting of SFFs 20 and 27, AND elements 21 and 25, OR elements 22 and 24, a NAND element 23 and an inverter element 26, and a clock terminal 28 to which a clock of 10 ns period is input as an at-speed test period, within an LSI not shown to be tested.

In this case, the loop/path disconnecting section 8 disconnects a path at a position where a delay of the path becomes 8 ns based on the calculation from D terminal of the SFF 20 so that the delay is accommodated within a test period, and inserts a test circuit 31, as shown in FIG. 8. Thus, delays in the paths before and after the test circuit 31 become 8 ns respectively. The test circuit 31 consists of a flip-flop (FF) 29 and a selector 30, and is controlled by a mode change-over terminal (a test mode terminal) 32 for changing over between the scan operation and the system operation.

The test circuit 31 operates such that when the test mode terminal 32 for scan test is "0" (during the system operation), an output value (output signal) of the NAND element 23 at a pre-stage is not passed to the FF 29 but is bypassed and propagated to the OR element 24. The test circuit 31 operates such that when the test mode terminal 32 is "1" (during the scan operation), the FF 29 can take in the output value of the NAND element 23. The test pattern generator 1 automatically controls the system operation and the scan operation by using the test mode terminal 32.

Figure 9:
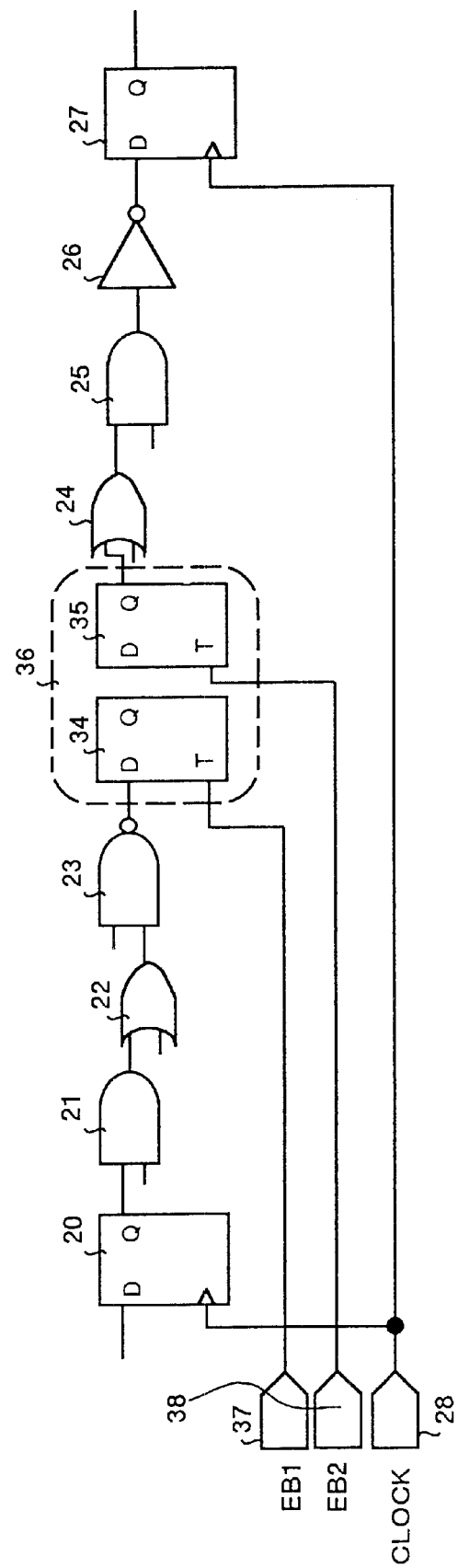
FIG. 9 shows an another example of a disconnected path.

In place of the test circuit 31, a test circuit 36 consisting of latches 34 and 35 may also be used as shown in FIG. 9. The change-over control between the data passing operation and the data holding operation of the latches 34 and 35 is carried out by enable terminals (EB terminals) 37 and 38. When the EB terminal 37 and the EB terminal 38 are "1", the EB terminals 37 and 38 become in the status of the data passing operation for passing the data, and pass the output value of the NAND element 23 at the pre-stage. On the other hand, when the EB terminal 37 is "1" and the EB terminal 38 is "0", the EB terminals become in, the status of the data holding operation for holding the data, and hold the output value of the NAND element 23. In this case, the test pattern generator 1 also automatically controls the system operation and the scan operation by using the EB terminals 37 and 38.

As described above, according to the first embodiment, in the loop disconnecting operation at the time of detecting a stack fault, a loop disconnecting position is optimized and a process of optimizing a value for the disconnection is repeated. Therefore, it becomes possible to select a position where the highest result can be obtained for controllability and observability, that is, a position where a fault detection rate is high. As a result, an optimum test can be executed.

Figure 10:
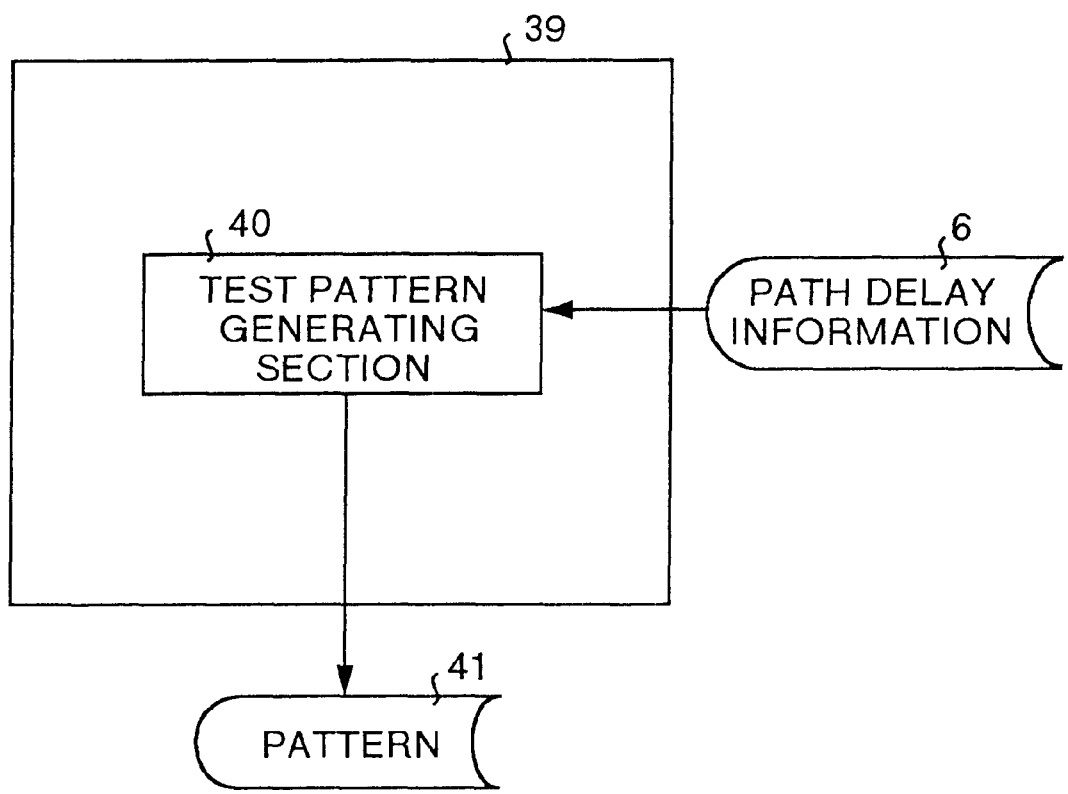
FIG. 10 is a schematic configuration of a test pattern generator according to a second embodiment of the present invention.

Further, in the path-disconnecting operation at the time of detecting a delay fault, a path is disconnected at an optimum position for the path having a delay of equal to or larger than the at-speed test period, and the circuit is changed over so that the operation of the disconnected portion can be controlled by an external terminal. Therefore, it is possible to test at speed a path having a delay equal to or larger than the at speed test period. As a result, an optimum test can be executed. Second embodiment FIG. 10 is an explanatory diagram for showing a schematic configuration of a test pattern generator according to a second embodiment of the present invention. A test pattern generator 39 according to the second embodiment includes a test pattern generating section 40 that receives the path delay information 6 and generates a pattern 41 according to a delay quantity of each path within an LSI not shown to be tested. A delay fault of the LSI is detected by the pattern 41 generated by the test pattern generating section 40. A path within the LSI has a structure similar to that of the path shown in FIG. 7, for example. The test pattern generating section 40 corresponds to the generating unit of the present invention.

Figure 11:
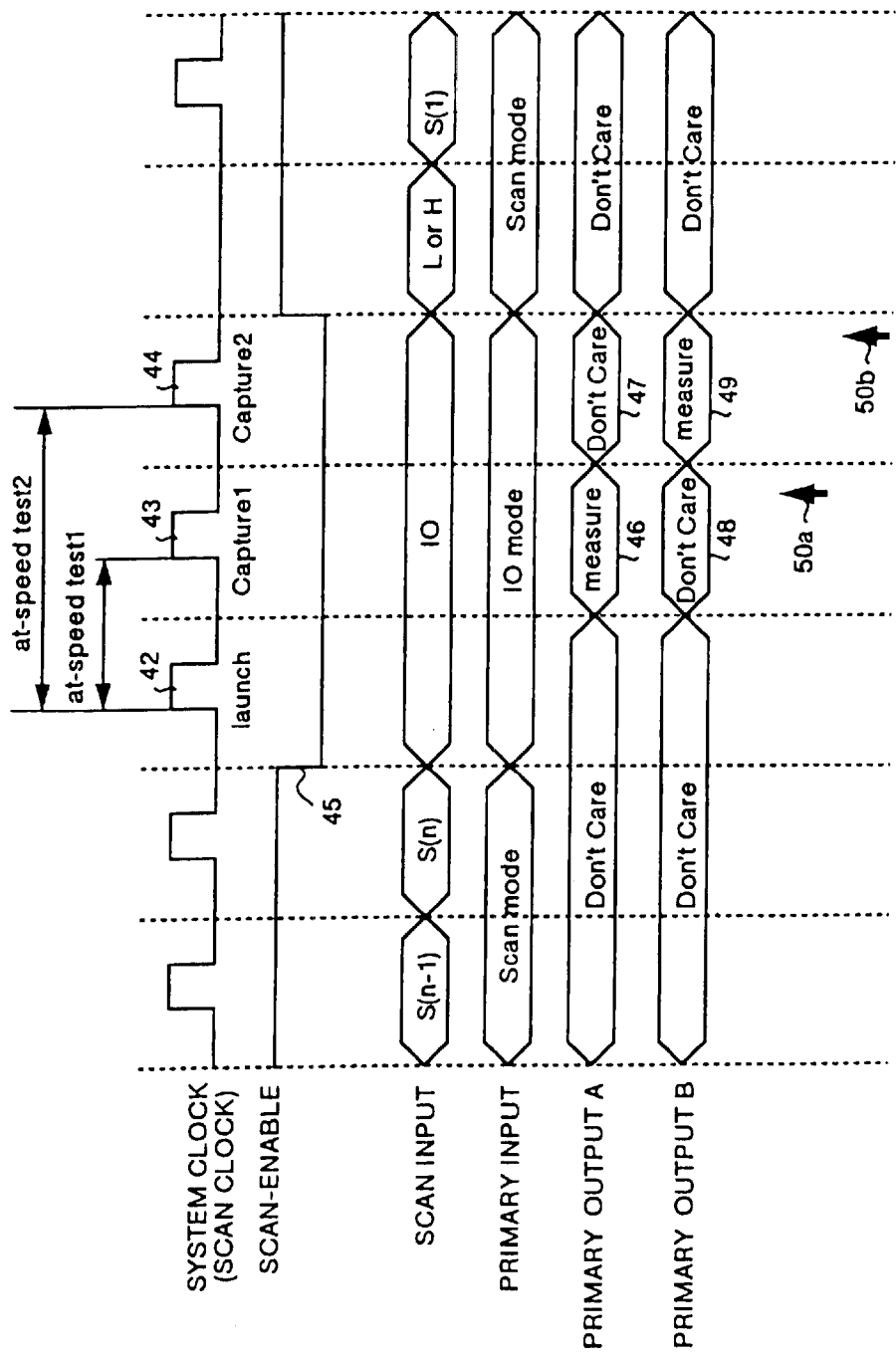
FIG. 11 is a timing chart showing a delay fault detecting operation according to the second embodiment.
Figure 12:
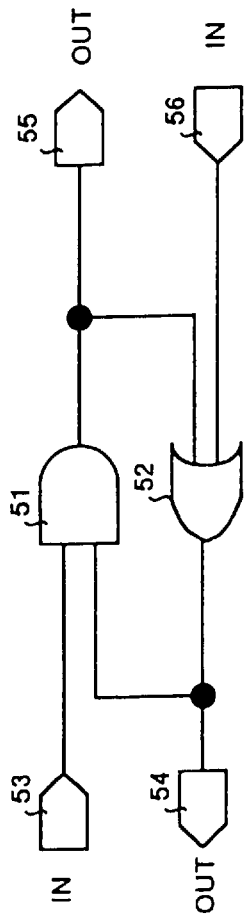
FIG. 12 is a circuit diagram that shows an example of a loop portion existing within an LSI.
Figure 13:
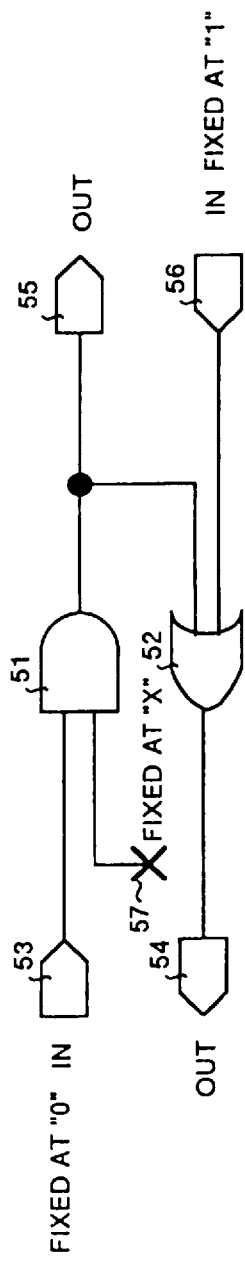
FIG. 13 is an explanatory diagram for explaining a prior-art method of disconnecting a loop within the LSI.
Figure 14:
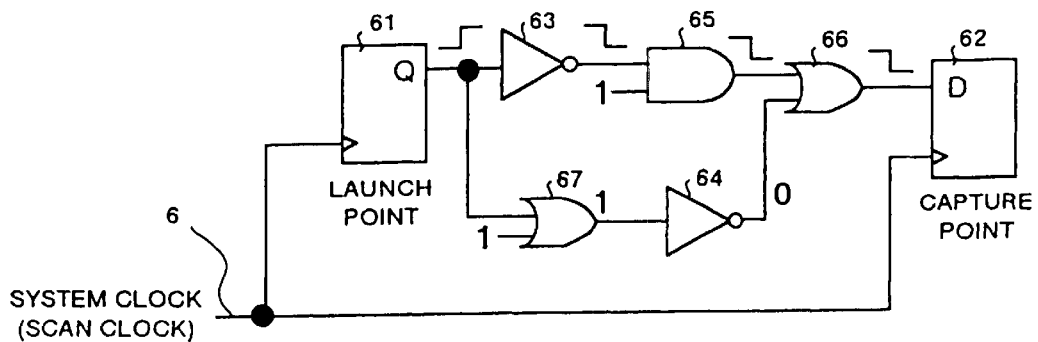
FIG. 14 is an explanatory diagram showing one example of a prior-art scan test circuit for detecting a delay fault.
Figure 15:
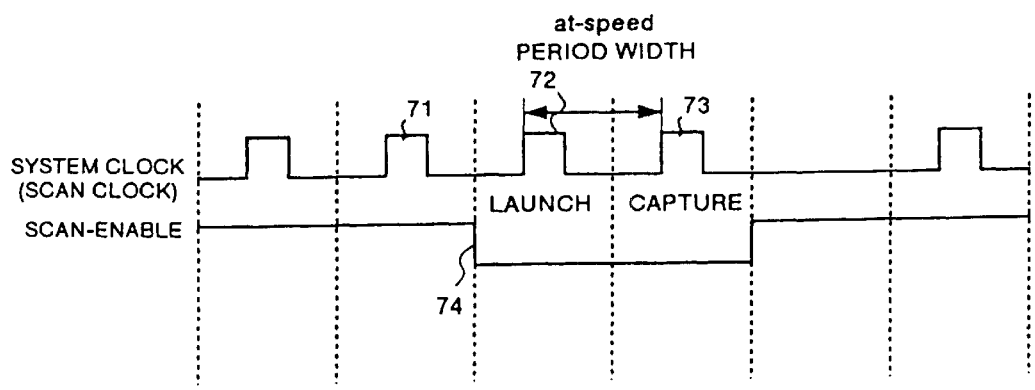
FIG. 15 is a timing chart for showing the operation of a delay fault detection in a prior-art scan test.

The operation of the second embodiment having the above-described structure will be explained with reference to a timing chart. FIG. 11 is a timing chart for showing a delay fault detecting operation according to the second embodiment. In the delay fault detecting operation according to the second embodiment, a clock of at-speed is input to a system clock (scan clock) terminal of an LSI not shown to be tested. When there has been a data change 45 for changing over from the scan operation to the system operation in the LSI-mode change-over terminal (enable terminal) that carries out a change-over between the scan operation and the system operation, the test pattern generating section 40 inputs clocks 42, 43 and 44 of a data take-in period, to the LSI.

In other words, during a period while an external input terminal (a primary input terminal) is in the I/O mode, after the data change 45, a clock of a data take-in period is input three times. In the example of FIG. 7, the clock 42 is a clock for setting a value for making the SFF20 within the LSI propagate to the combination circuit to detect a delay fault. The clocks 43 and 44 are capture clocks for confirming whether a value propagated through the combination circuit has been propagated to the SFF 27 within a test period or not.

The test pattern generating section 40 generates patterns for a path having a delay within the at-speed test period and a path having a delay of equal to or larger than the at-speed test period, based on the path delay information 6, at the time of the at-speed test (a test using the clock of at-speed). Thus, for the path having a delay within the at-speed test period, the at-speed test is carried out by using the clocks 42 and 43. In other words, in the period of the data take-in clock 43, the value of the external output terminal A (including the primary output terminal A and the scan-out terminal) of the LSI is observed, at the timing of a time 50a (46 in FIG. 11). For the value taken in by the data take-in clock 44, a mask (Don't care) processing is carried out, and the value of the external output terminal A is not observed (47 in FIG. 11).

On the other hand, for the path having a delay equal to or larger than the at-speed test period, the at-speed test is carried out by using the clocks 43 and 44. In other words, in the period of the data take-in clock 44, the value of the external output terminal B (including the primary output terminal B and the scan-out terminal) of the LSI is observed, at the timing of a time 50b (49 in FIG. 11). For the value taken in by the data take-in clock 43, a mask (Don't care) processing is carried out, and the value of the external output terminal B is not observed (48 in FIG. 11).

As described above, according to the second embodiment, it is possible to detect a delay fault by successively inputting a capture clock at least two times to the path having a delay equal to or larger than the at-speed test period, without disconnecting the path, in other words, without changing the circuit structure. Therefore, it is possible to increase the fault detection rate and to carry out a suitable test. Further, it is not necessary to carry out a verification for checking whether a disconnection is suitable or not. As a result, the test time can be decreased.

As described above, in the test pattern generator according to this invention, the disconnecting unit automatically disconnects a loop portion of the integrated circuit at an optimum position where the fault detection rate is not lowered, based on the circuit structure information and the condition of constraint. Thus, since it becomes possible to optimize the position where the loop is disconnected, there is obtained an effect that the percentage of fault detection can be increased as well as an optimal test can be conducted.

Further, the disconnecting unit automatically disconnects a disconnection end at a value which does not lower the fault detection rate, based on the circuit structure information and the condition of constraint. Thus, since it becomes possible to optimize the position where the loop is disconnected and to optimize the value of disconnection, there is obtained an effect that the percentage of fault detection can be increased as well as an optimal test can be conducted.

Further, in the test pattern generator according to this invention, a disconnecting unit automatically disconnects a propagation path having a delay exceeding a test period at an optimum position where the delay is accommodated within the test period so that the fault detection rate is not lowered, based on the circuit structure information, the condition of constraint and the delay information. Thus, it becomes possible to optimize the position where the propagation path is disconnected so that it becomes possible to detect a delay fault of the propagation path having a delay exceeding the test period of the frequency of the actual operation. Therefore, there is obtained an effect that the percentage of fault detection can be increased as well as an optimal test can be conducted.

Further, the disconnecting unit automatically sets a disconnection end at a value which does not lower a fault detection rate, based on the circuit structure information, the condition of constraint and the delay information. Thus, since becomes possible to optimize the position where the propagation path is disconnected and to optimize the value for the disconnection, there is obtained an effect that the percentage of fault detection can be increased as well as an optimal test can be conducted.

Further, in the test pattern generator according to this invention, the generating unit applies a data take-in clock to the propagation path by at least two times and generate a pattern for observing a value taken in by the clock according to the delay information of the propagation path. Thus, it becomes possible to detect a delay fault of a propagation path having a delay exceeding the test period of the frequency of the actual operation, without disconnecting the propagation path, in other words, without changing the circuit structure. Therefore, there is obtained an effect that the percentage of fault detection can be increased as well as an optimal test can be conducted. Further, there is no need-to check whether the disconnection is proper or not, so that the testing time can be shortened.

In the test loop disconnecting method according to this invention, a loop position of the integrated circuit is automatically disconnected at an optimum position so that the fault detection rate is not lowered, based on the circuit structure information and the condition of constraint at the disconnection process. Thus, at the time of automatically generating a test pattern, in detecting a stack fault using a scan test method, it is possible to optimize the position where the loop is disconnected. Therefore, there is obtained an effect that the percentage of fault detection can be increased as well as an optimal test can be conducted.

Further, the disconnection end is automatically set at a value which does not lower the fault detection rate, based on the circuit structure information and the condition of constraint at the setting process. Thus, in detecting a stack fault using a scan test method, at the time of automatically generating a test pattern, it is possible to optimize the position where the loop is disconnected and to optimize the value for the disconnection. Therefore, there is obtained an effect that the percentage of fault detection can be increased as well as an optimal test can be conducted.

In the propagation path disconnecting method according to this invention, in a disconnection process, a propagation path having a delay exceeding a test period is automatically disconnected at an optimum position where the delay is accommodated within the test period so that the fault detection rate is not lowered, based on the circuit structure information, the condition of constraint and the delay information. Thus, in the detection of a delay fault using a scan test method, at the time of automatically generating a test pattern, it is possible to optimize the position where the propagation path is disconnected so that it becomes possible to detect a delay fault of the propagation path having a delay exceeding the test period of the frequency of the actual operation. Therefore, there is obtained an effect that the percentage of fault detection can be increased as well as an optimal test can be conducted.

Further, in the setting process, a disconnection end is automatically set at a value which does not lower a fault detection rate, based on the circuit structure information, the condition of constraint and the delay information. Thus, in the detection of a delay fault using a scan test method, at the time of automatically generating a test pattern, it is possible to optimize the position where the propagation path is disconnected and to optimize the value for the disconnection, as well. Therefore, there is obtained an effect that the percentage of fault detection can be increased as well as an optimal test can be conducted.

In the delay fault detecting method according to this invention, in the application process, a data take-in clock is applied to the propagation path by at least two times, and at the observation process, a value taken in by the clock according to the delay information of the propagation path is observed. Thus, it becomes possible to detect a delay fault of a propagation path having a delay exceeding the test period of the frequency of the actual operation, without disconnecting the propagation path, in other words, without changing the circuit structure. Therefore, there is obtained an effect that the percentage of fault detection can be increased as well as an optimal test can be conducted. Further, there is no need to check whether the disconnection is proper or not, so that the testing time can be shortened.

A program for making a computer execute the above-described methods according to the invention can be recorded on a recording medium according to this invention. Thus, it becomes possible to make the computer execute the above-described methods according to this invention. Therefore, there is obtained an effect that the percentage of fault detection can be increased as well as an optimal test can be conducted.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A test pattern generator for automatically generating a pattern for detecting a delay fault of a propagation path of an integrated circuit with a tester, said test pattern generator comprising:
   a disconnecting unit for disconnecting a propagation path having a delay exceeding a test period, at a position where the delay is accommodated within the test period, by inserting circuits including a selector and a flip-flop supplying a signal to the selector, so that fault detection rate is not lowered, based on circuit structure of the integrated circuit, a test design rule constraint, and propagation path delay, while automatically generating the pattern.

2. The test pattern generator according to claim 1, wherein said disconnecting unit sets a disconnected end of the propagation path to a value which does not lower the fault detection rate, based on the circuit structure, the test design rule constraint, and the propagation path delay.

3. A propagation path disconnecting method for disconnecting a propagation path of an integrated circuit to detect a delay fault of the propagation path with a tester, the propagation path disconnecting method comprising:

disconnecting a propagation path having a delay exceeding a test period, at a position where the delay is accommodated within the test period, by inserting circuits including a selector and a flip-flop supplying a signal to the selector, so that fault detection rate is not lowered, based on circuit structure of the integrated circuit, a test design rule constraint, and propagation path delay.

4. The propagation path disconnecting method according to claim 3, further comprising:

setting a disconnected end of the propagation path to a value which does not lower the fault detection rate, based on the circuit structure, the test design rule constraint, and the propagation path delay.

5. A delay fault detecting method for detecting a delay fault of a propagation path of an integrated circuit comprising:

applying a clock to the propagation path three times, within a test period, for determining whether a value for detecting a delay fault has been propagated; and observing a value in response to the clock, according to delay information of the propagation path.

* * * * *